United States Patent
Hardin (10) Patent No.: US 7,955,875 B2
(45) Date of Patent: Jun. 7, 2011

(54) FORMING LIGHT EMITTING DEVICES INCLUDING CUSTOM WAVELENGTH CONVERSION STRUCTURES

(75) Inventor: Craig Hardin, Apex, NC (US)

(73) Assignee: Cree, Inc., Durham, NC (US)

( * ) Notice: Subject to any disclaimer, the term of this patent is extended or adjusted under 35 U.S.C. 154(b) by 292 days.

(21) Appl. No.: 12/238,976

(22) Filed: Sep. 26, 2008

(65) Prior Publication Data

US 2010/0081218 A1   Apr. 1, 2010

(51) Int. Cl.
*H01L 21/00* (2006.01)

(52) U.S. Cl. .............. 438/7; 438/29; 438/30; 438/31; 438/32; 438/33; 438/34; 438/35; 438/36; 438/37; 438/121; 438/122; 438/124; 438/127; 257/81; 257/89; 257/94; 257/95; 257/96; 257/97; 257/98; 257/99; 257/100; 257/E33.006; 257/E33.014; 257/E21.04; 257/788; 257/724; 257/725; 257/685; 257/795; 257/643

(58) Field of Classification Search .......... 438/7, 29–37, 438/121–122, 124, 127; 257/81, 89, 94–100, 257/E33.006, E33.014, E21.04, 788, 685, 257/724, 725, 789, 795, 643, E33.061; 313/485–486, 512, 496
See application file for complete search history.

(56) References Cited

U.S. PATENT DOCUMENTS

| | | | |
|---|---|---|---|
| 4,918,497 A | 4/1990 | Edmond | |
| 4,966,862 A | 10/1990 | Edmond | |
| 5,027,168 A | 6/1991 | Edmond | |
| 5,133,987 A * | 7/1992 | Spence et al. | 427/581 |
| 5,210,051 A | 5/1993 | Carter, Jr. | |
| 5,238,639 A * | 8/1993 | Vinson et al. | 264/401 |
| 5,309,454 A * | 5/1994 | Taira | 372/21 |
| 5,338,944 A | 8/1994 | Edmond et al. | |
| 5,358,673 A * | 10/1994 | Heller et al. | 264/401 |
| 5,393,993 A | 2/1995 | Edmond et al. | |
| 5,416,342 A | 5/1995 | Edmond et al. | |
| 5,484,314 A * | 1/1996 | Farnworth | 445/24 |
| 5,523,589 A | 6/1996 | Edmond et al. | |
| 5,541,525 A | 7/1996 | Wood et al. | |

(Continued)

FOREIGN PATENT DOCUMENTS

EP   1 139 440   10/2001

(Continued)

OTHER PUBLICATIONS

International Search Report for PCT/US02/34484 dated Oct. 28, 2002.

(Continued)

*Primary Examiner* — N Drew Richards
*Assistant Examiner* — Ankush k Singal
(74) *Attorney, Agent, or Firm* — Myers Bigel Sibley & Sajovec (57) ABSTRACT

Methods of forming a light emitting device include selectively forming a wavelength conversion structure on a light emitting element using stereolithography. Selectively forming the wavelength conversion structure may include covering the light emitting element with a photo-curable liquid polymer containing a luminescent material, and exposing the liquid polymer to light for a time sufficient to at least partially cure the liquid polymer. Multiple layers of polymer can be selectively built up to form a wavelength conversion structure having a custom shape on the light emitting element.

18 Claims, 8 Drawing Sheets

U.S. PATENT DOCUMENTS

| | | | |
|---|---|---|---|
| 5,604,135 A | 2/1997 | Edmond et al. | |
| 5,631,190 A | 5/1997 | Negley | |
| 5,658,412 A * | 8/1997 | Retallick et al. | 156/272.8 |
| 5,739,554 A | 4/1998 | Edmond et al. | |
| 5,814,265 A * | 9/1998 | Hull | 264/401 |
| 5,898,185 A | 4/1999 | Bojarczuk, Jr. et al. | |
| 5,912,477 A | 6/1999 | Negley | |
| 5,945,058 A * | 8/1999 | Manners et al. | 264/401 |
| 5,952,681 A | 9/1999 | Chen | |
| 5,962,971 A | 10/1999 | Chen | |
| 5,998,805 A | 12/1999 | Shi et al. | |
| 6,048,487 A * | 4/2000 | Almquist et al. | 264/401 |
| 6,120,600 A | 9/2000 | Edmond et al. | |
| 6,129,884 A * | 10/2000 | Beers et al. | 264/401 |
| 6,155,699 A * | 12/2000 | Miller et al. | 362/293 |
| 6,187,606 B1 | 2/2001 | Edmond et al. | |
| 6,201,264 B1 | 3/2001 | Khare et al. | |
| 6,245,259 B1 * | 6/2001 | Hohn et al. | 252/301.36 |
| 6,252,254 B1 * | 6/2001 | Soules et al. | 257/89 |
| 6,303,916 B1 | 10/2001 | Gladnick | |
| 6,344,661 B1 | 2/2002 | Nagase et al. | |
| 6,391,504 B2 * | 5/2002 | Tai et al. | 430/26 |
| 6,395,564 B1 | 5/2002 | Huang | |
| 6,518,600 B1 * | 2/2003 | Shaddock | 257/98 |
| 6,580,097 B1 * | 6/2003 | Soules et al. | 257/100 |
| 6,621,211 B1 * | 9/2003 | Srivastava et al. | 313/503 |
| 6,635,503 B2 | 10/2003 | Andrews et al. | |
| 6,646,728 B1 * | 11/2003 | Tang et al. | 356/122 |
| 6,682,331 B1 * | 1/2004 | Peh et al. | 425/112 |
| 6,682,688 B1 * | 1/2004 | Higashi et al. | 264/497 |
| 6,709,795 B2 * | 3/2004 | Farnworth et al. | 430/18 |
| 6,791,116 B2 * | 9/2004 | Takahashi et al. | 257/79 |
| 6,803,903 B1 * | 10/2004 | Ostergård et al. | 345/168 |
| 6,849,223 B2 * | 2/2005 | Dean et al. | 264/400 |
| 6,917,057 B2 * | 7/2005 | Stokes et al. | 257/98 |
| 7,021,915 B2 * | 4/2006 | Farnworth | 425/110 |
| 7,256,057 B2 * | 8/2007 | Schardt et al. | 438/14 |
| 7,321,191 B2 * | 1/2008 | Setlur et al. | 313/487 |
| 7,326,583 B2 * | 2/2008 | Andrews et al. | 438/26 |
| 7,358,502 B1 * | 4/2008 | Appleby et al. | 250/370.14 |
| 7,405,433 B2 * | 7/2008 | Chew | 257/99 |
| 7,547,978 B2 * | 6/2009 | Hembree et al. | 257/788 |
| 7,582,906 B2 * | 9/2009 | Kurihara | 257/79 |
| 7,687,823 B2 * | 3/2010 | Amo et al. | 257/99 |
| 7,718,991 B2 * | 5/2010 | Negley | 257/13 |
| 2001/0046553 A1 * | 11/2001 | Umemoto et al. | 427/68 |
| 2002/0057056 A1 * | 5/2002 | Okazaki | 313/512 |
| 2002/0123164 A1 | 9/2002 | Slater, Jr. et al. | |
| 2002/0142237 A1 * | 10/2002 | Tai et al. | 430/26 |
| 2003/0006418 A1 | 1/2003 | Emerson et al. | |
| 2003/0089918 A1 | 5/2003 | Hiller et al. | |
| 2003/0094893 A1 * | 5/2003 | Ellens et al. | 313/503 |
| 2003/0155693 A1 * | 8/2003 | Farnworth et al. | 264/401 |
| 2003/0209837 A1 * | 11/2003 | Farnworth | 264/401 |
| 2004/0007961 A1 * | 1/2004 | Srivastava et al. | 313/486 |
| 2004/0056260 A1 | 3/2004 | Slater, Jr. et al. | |
| 2004/0142058 A1 * | 7/2004 | Farnworth | 425/174.4 |
| 2004/0150316 A1 * | 8/2004 | Setlur et al. | 313/483 |
| 2004/0222735 A1 * | 11/2004 | Ragle | 313/501 |
| 2004/0232829 A1 * | 11/2004 | Ohshita et al. | 313/504 |
| 2004/0263074 A1 * | 12/2004 | Baroky et al. | 313/512 |
| 2005/0124258 A1 * | 6/2005 | Appelberg et al. | 445/24 |
| 2005/0224830 A1 * | 10/2005 | Blonder et al. | 257/100 |
| 2006/0006503 A1 * | 1/2006 | Farnworth | 257/642 |
| 2006/0012299 A1 * | 1/2006 | Suehiro et al. | 313/512 |
| 2006/0073625 A1 * | 4/2006 | Harada | 438/29 |
| 2006/0097621 A1 * | 5/2006 | Park et al. | 313/485 |
| 2006/0214578 A1 * | 9/2006 | Iwanaga et al. | 313/512 |
| 2007/0001182 A1 * | 1/2007 | Schardt et al. | 257/98 |
| 2007/0001321 A1 * | 1/2007 | Hembree et al. | 257/788 |
| 2007/0020814 A1 * | 1/2007 | Hembree et al. | 438/124 |
| 2008/0054279 A1 * | 3/2008 | Hussell et al. | 257/95 |
| 2008/0088223 A1 * | 4/2008 | Jeong et al. | 313/496 |
| 2008/0211386 A1 * | 9/2008 | Choi et al. | 313/503 |
| 2008/0231170 A1 * | 9/2008 | Masato et al. | 313/501 |
| 2008/0308825 A1 * | 12/2008 | Chakraborty et al. | 257/98 |
| 2009/0091258 A1 * | 4/2009 | Heuser et al. | 313/512 |
| 2009/0179213 A1 * | 7/2009 | Cannon et al. | 257/98 |

FOREIGN PATENT DOCUMENTS

| | | |
|---|---|---|
| WO | WO97/48138 | 12/1997 |
| WO | WO 00/12649 A1 | 3/2000 |

OTHER PUBLICATIONS

"Stereolithography", Wikipedia Encyclopedia; http://en.wikipedia.org/wiki/Stereolithography, (4 pages)Last download Sep. 16, 2008.

"Rapid Prototyping:SLA", Efunda Engineering Fundamentals; http://efunda.com/processes/rapid_prototyping/sla.cfm, (4 pages)Last download Sep. 16, 2008.

* cited by examiner

FORMING LIGHT EMITTING DEVICES INCLUDING CUSTOM WAVELENGTH CONVERSION STRUCTURES

BACKGROUND

The present invention relates to semiconductor devices, and more particularly, to semiconductor devices for producing light.

Broad spectrum light emitting semiconductor devices have conventionally been fabricated by exciting a luminous substance, such as a phosphor or a phosphor-loaded material, with a relatively narrow spectrum light source. Conventionally, in such devices a light emitting diode (LED) or laser emits light in a narrow spectrum which is shifted and/or spread in wavelength to provide a broader spectrum of light. Typically, it is desirable to provide white light from a narrow spectrum light source, such as an LED or laser. Such white light sources are described, for example, in U.S. Pat. No. 6,245,259, the disclosure of which is incorporated herein by reference as if set forth fully herein.

Typically, a white LED is formed by coating a blue emitting LED with an encapsulant material, such as a resin or silicone, that includes a luminescent material, such as a YAG:Ce phosphor, that emits yellow light in response to stimulation with blue light. Some, but not all, of the blue light that is emitted by the LED is absorbed by the phosphor, causing the phosphor to emit yellow light. The blue light emitted by the LED that is not absorbed by the phosphor combines with the yellow light emitted by the phosphor to produce light that is perceived as white by an observer. Other combinations are possible. For example, a red-emitting phosphor can be mixed with the yellow phosphor to produce light having a better color temperature and/or better color rendering properties.

One difficulty with the fabrication of white light devices is that, typically, the spectrum of light emitted by the devices is dependent on the spectrum of light emitted by the laser or LED and the amount and/or distribution of luminescent material on the device. On a single wafer or die there may be variations in the wavelength of light emitted by the particular devices on the wafer or die. Furthermore, when devices are mounted in a package, there may be variations in wavelength or intensity of emitted light from package to package. Such deviations may, for example, be the result of defects in the devices or variations as a result of manufacturing tolerances. These deviations in the output wavelength of the underlying devices may result in variations in the white light emitted by the resulting devices after application and excitation of the luminescent material. Furthermore, some methods of applying luminescent materials may result in uneven color emission from the light emitting device.

SUMMARY

Embodiments of the present invention provide broad spectrum light emitting devices and methods and systems for fabricating such devices. Such devices may include a light emitting element, such as a diode (mounted or unmounted), which emits light in a predefined range of frequencies, and an amount of luminescent material on the light emitting element. The amount and/or shape of luminescent material provided on the element may be based on a measured output of the light emitting element.

Methods of forming a light emitting device according to some embodiments include selectively forming a wavelength conversion structure on a light emitting element using stereolithography.

The methods may include measuring light output of the light emitting element, and selectively forming the wavelength conversion structure may include selectively forming the wavelength conversion structure based on the measured light output of the light emitting element. The measured light output may include at least one of a frequency of light output and/or a radiant flux of light output.

The methods may further include repeating the measurement of light output and the selective formation of layers of luminescent material until the measured light output of the light emitting element including the layers of luminescent material meets a predefined criterion.

The light emitting element may include a light emitting diode chip and/or a light emitting diode package.

Selectively forming the wavelength conversion structure may include covering the light emitting element with a photo-curable liquid polymer containing a luminescent material, and exposing the liquid polymer to light for a time sufficient to at least partially cure the liquid polymer. In some embodiments, layers of cured polymer may be selectively formed on the light emitting element based on the measured light output of the light emitting element. The polymer layers may be selectively shaped on the light emitting element.

Selectively forming the wavelength conversion structure may include repeatedly covering the light emitting element with a photo-curable liquid polymer containing a luminescent material and exposing the liquid polymer to a laser beam in a predefined pattern for a time sufficient to at least partially cure the liquid polymer, to thereby build up a wavelength conversion structure having a desired shape on the light emitting element.

The light emitting element may include a substrate including a plurality of light emitting diodes thereon. Measuring light output of a semiconductor light emitting element may include measuring light output of respective ones of the light emitting elements, and selectively forming the wavelength conversion structure may include selectively forming polymer layers on respective ones of the light emitting elements based on the measured light output of the respective light emitting elements.

Selectively forming the wavelength conversion structure may include applying at least one of different thicknesses of luminescent material, differently doped luminescent material and/or different luminescent materials to different ones of the light emitting elements.

The wavelength conversion structure may include a first wavelength conversion structure including a first luminescent material, and the methods may further include forming a second wavelength conversion structure on the first wavelength conversion structure, the second wavelength conversion structure including a second luminescent material that has a different optical property than the first luminescent material.

Methods of forming a light emitting apparatus according to further embodiments include covering a light emitting element with a photo-curable liquid polymer containing a luminescent material, and selectively exposing a portion of the liquid polymer to light for a time sufficient to at least partially cure the exposed portion of liquid polymer.

The methods may further include repeatedly covering the light emitting element with a photo-curable liquid polymer containing a luminescent material and selectively exposing portions of the liquid polymer to a laser beam for a time sufficient to at least partially cure the exposed portions of liquid polymer, to thereby build up a wavelength conversion structure having a desired shape on the light emitting element.

The luminescent material may include a first luminescent material, and the methods may further include covering the light emitting element with additional photo-curable liquid polymer containing a second luminescent material having a different optical property than the first luminescent material, and selectively exposing a portion of the additional liquid polymer to light for a time sufficient to at least partially cure the additional liquid polymer. Exposing the liquid polymer to light may include directing a laser beam towards the liquid polymer in a predetermined pattern.

The methods may further include covering the light emitting element including the at least partially cured liquid polymer with additional photo-curable liquid polymer containing a second luminescent material having a different optical property than the first luminescent material, and directing a laser beam towards the liquid polymer in a second pattern that is different from the first pattern for a time sufficient to at least partially cure the additional liquid polymer in the second pattern.

Methods of forming a light emitting device according to further embodiments include forming a first wavelength conversion structure on a light emitting element, measuring light output of the semiconductor light emitting element including the first wavelength conversion structure, and selectively forming a second wavelength conversion structure on the light emitting element using stereolithography based on the measured light output of the light emitting element.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

The drawings are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Embodiments of the present invention provide broad spectrum light emitting devices and methods and systems for fabricating such devices. Such devices may include a light emitting element, such as a light emitting diode (LED) or an LED package including at least one LED mounted therein, which emits light in a range of frequencies, and an amount of luminescent material on the light emitting element. Light emitting diodes (LEDs) and LED packages including LEDs mounted therein are referred to generally herein as "light emitting elements." LEDs and LED packages on which a wavelength conversion structure are formed are referred to generally herein as "light emitting devices." The amount, type and/or shape of luminescent material provided on the device may be based on a measured output of the light emitting device.

Figure 1A:
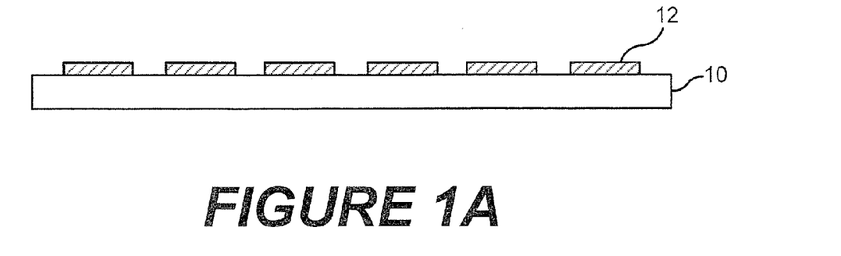
FIGS. 1A to 1C are side views and FIG. 1D is a plan view of semiconductor wafers including light emitting elements thereon.
Figure 1B:
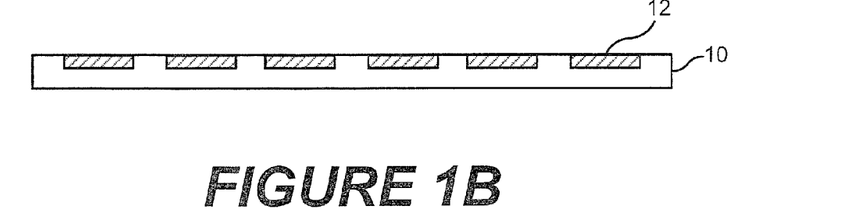
Figure 1C:
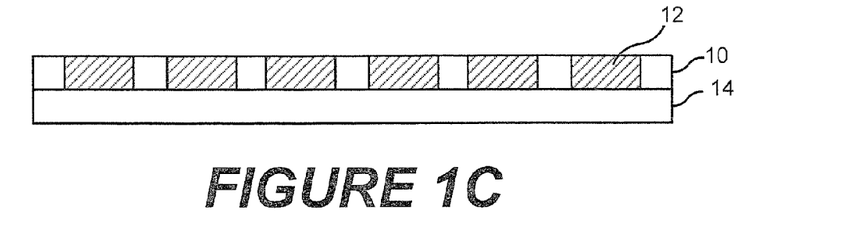

FIGS. 1A, 1B and 1C illustrate a plurality of light emitting diodes 12 that are formed on, in or through a substrate 10. The substrate 10 may be a semiconductor substrate on which one or more epitaxial semiconductor layers are formed. In some embodiments, the substrate 10 may be a support substrate onto which one or more devices and/or epitaxial layers have been mounted. In some embodiments, the substrate 10 includes epitaxial layers that have been removed from a growth substrate. As shown in FIG. 1C, an optional support substrate 14 may be provided for mechanically supporting the substrate 10.

Figure 1D:
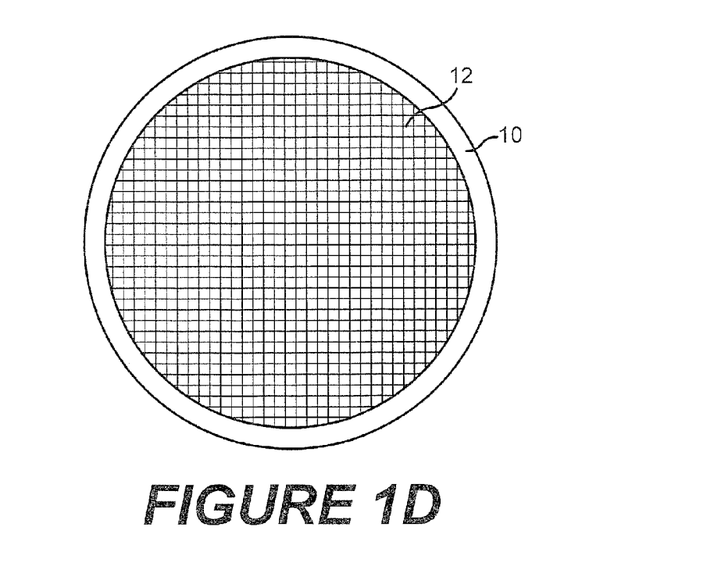

Referring to FIG. 1D, the substrate 10 may include a generally circular semiconductor wafer, and the light emitting diodes 12 may be formed on/in a first surface of the wafer. The light emitting diodes 12 may include metallization layers including anode and/or cathode contacts, and may be isolated from one another, for example, by trenches formed in the substrate 10, implant isolation and/or other techniques.

Figure 2A:
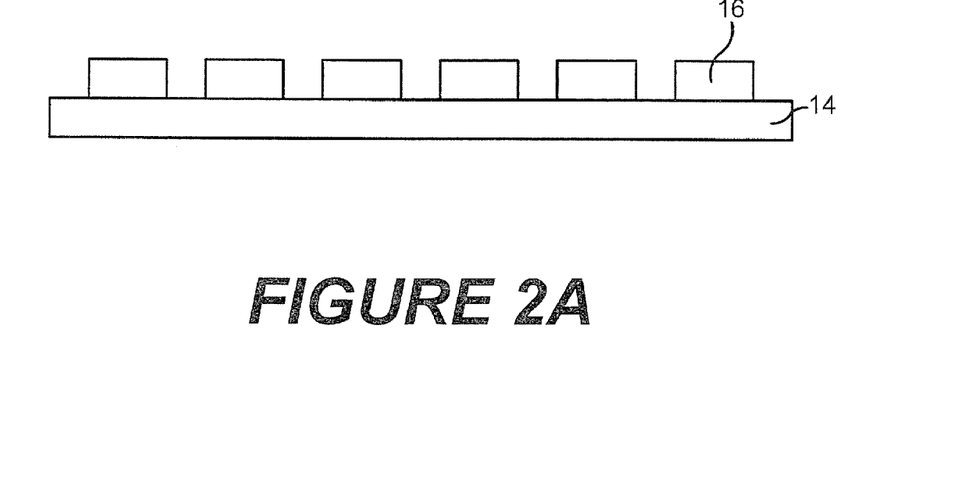
FIG. 2A is a side view and FIG. 2B is a plan view of a support substrate including LED packages thereon.
Figure 2B:
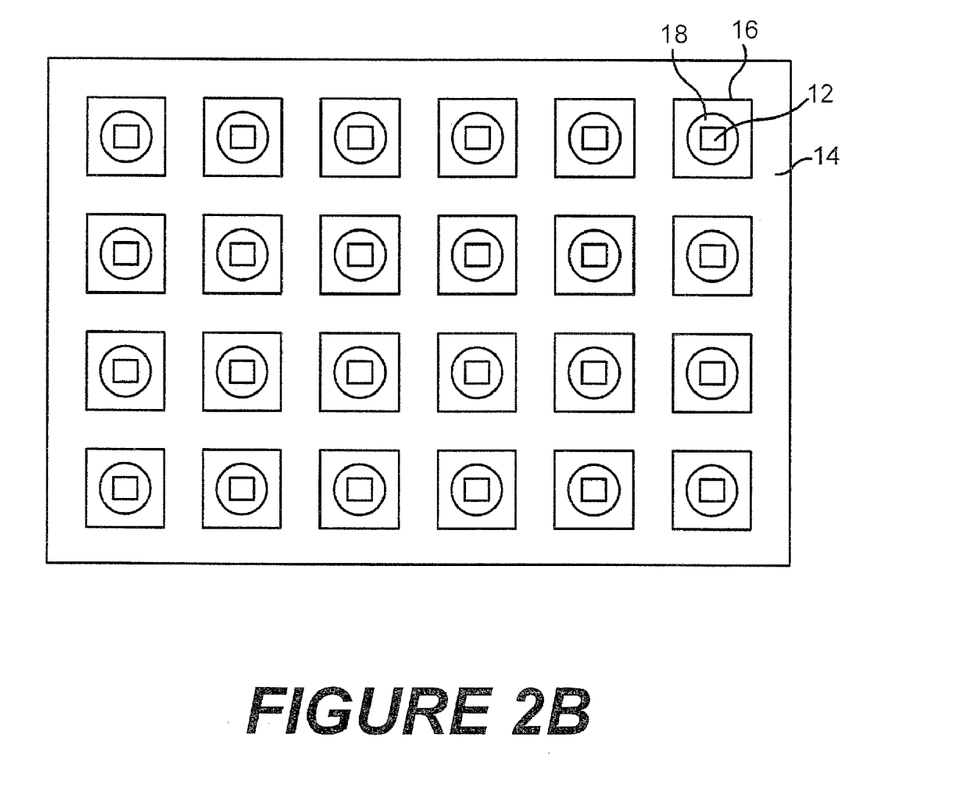

FIGS. 2A and 2B illustrate a support substrate 14 on which a plurality of LED packages 16 are mounted. One or more light emitting diodes 12 may be mounted within optical cavities 18 in the LED packages 16.

As noted above, in order to cause the light emitting element 12, 16 to emit broad spectrum light, it is possible to provide a wavelength conversion layer/structure on or over the light emitting element 12, 16. The wavelength conversion structure may include, for example, a wavelength conversion phosphor that absorbs at least a portion of the light emitted by the LED 12 and responsively emits light having a longer wavelength.

Many different types of phosphor are available, including phosphors that can, for example, emit red, green, and/or yellow light in response to excitation by UV or blue light. Suitable red phosphors include $Sr_2Si_5N_8:Eu^{2+}$, and $CaAlSiN_3$:Eu. Other red phosphors that can be used include phosphors from the $Eu^{2+}$-SiAlON family of phosphors, as well as $CaSiN_2:Ce^{3+}$, $CaSiN_2:Eu^{2+}$ and/or phosphors from the (Ca, Si,Ba)$SiO_4:Eu^{2+}$ (BOSE) family. Suitable yellow phosphors include $Y_3Al_5O_{12}:Ce^{3+}$ (Ce:YAG), $CaAlSiN_3:Ce^{3+}$, and phosphors from the $Eu^{2+}$-SiAlON-family, and/or the BOSE family. Suitable green phosphors include phosphors from the BOSE family, as well as $CaSi_2O_2N_2:Eu^{2+}$. The phosphor may also be doped at any suitable level to provide a desired wavelength of light output. In some embodiments, Ce and/or Eu may be doped into a phosphor at a dopant concentration in a range of about 0.1% to about 20%. Suitable phosphors are available from numerous suppliers, including Mitsubishi Chemical Corporation, Tokyo, Japan, Leuchtstoffwerk Breitungen GmbH, Breitungen, Germany, and Intematix Company, Fremont, Calif.

The color, intensity and/or uniformity of light emitted by a broad spectrum LED are affected by a number of parameters of the device. For example, the color, intensity and/or uniformity of light emitted by a broad spectrum LED can be affected by the dominant wavelength of the primary light emitted by the LED 12, the brightness of the primary light emitted by the LED 12, the shape of the LED package 16, if any, and/or the type, thickness and/or shape of the wavelength conversion structure formed on the LED 12 and/or the LED package 16.

When light emitting diodes are fabricated as semiconductor devices on a growth substrate (referred to herein as an LED wafer), the operational parameters of the light emitting elements may vary across the surface of the substrate due to slight variations in the fabrication process. Once an LED wafer has been fabricated, the devices on the wafer can be selectively activated with a prober, and the light emission characteristics, such as intensity of emission (i.e., radiant flux), dominant wavelength, FWHM (full-width half maximum, a measure of spectral distribution), angular emission pattern, etc. of the devices can be measured.

Figure 3:
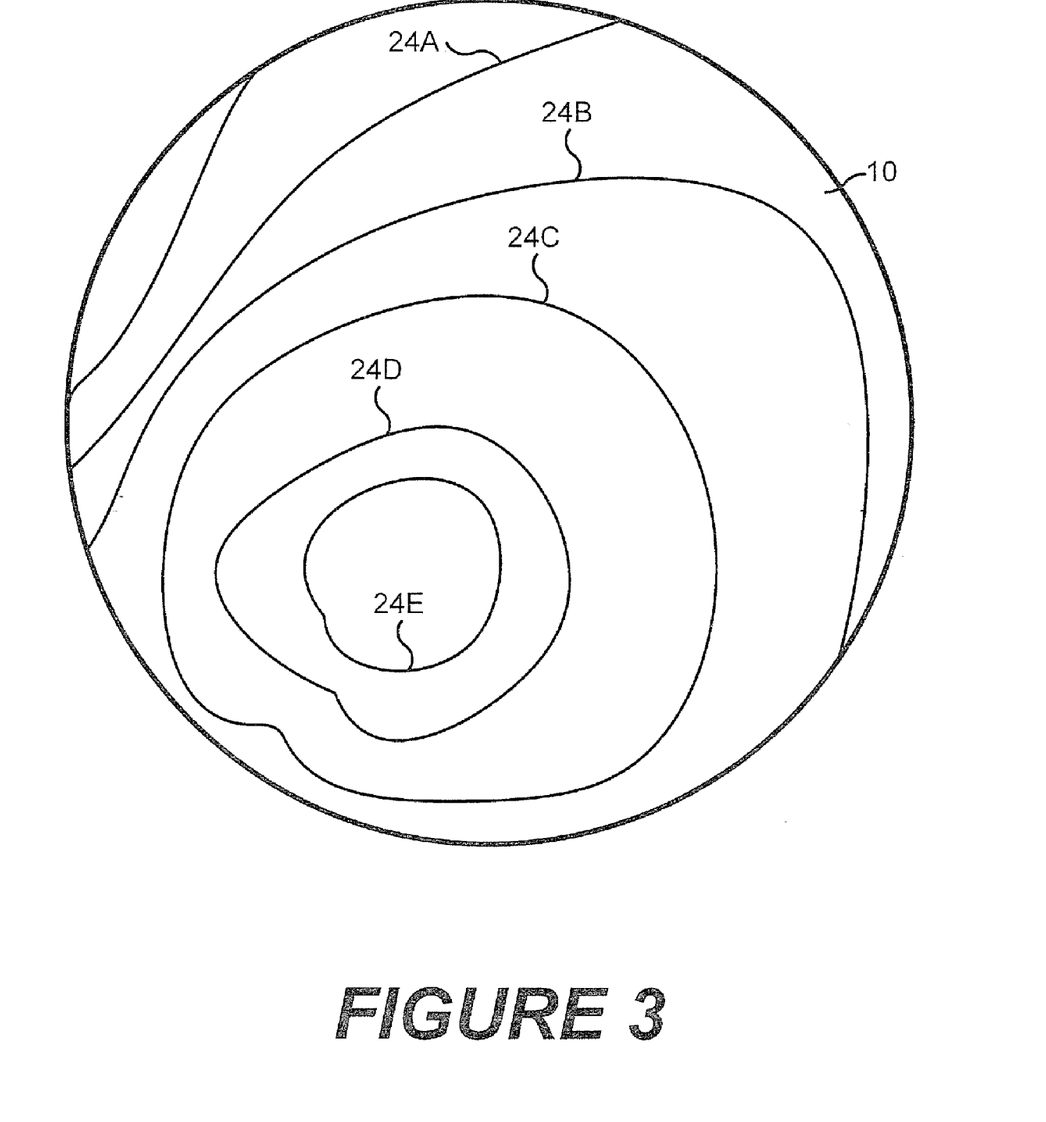
FIG. 3 is a wafer map showing optical properties of light emitting elements formed on a semiconductor wafer.

FIG. 3 illustrates a map of an LED wafer 10 that has been probed and tested to determine the dominant wavelength of light emitted by devices at various locations on the LED wafer 10. The curves 24A to 24E may represent curves of relatively constant dominant wavelength, relatively constant radiant flux, or any other measured parameter of the LEDs on the LED wafer 10. Thus, for example, diodes formed at locations along curve 24A may have a similar dominant wavelength that is different from the dominant wavelength of diodes formed at locations along curves 24B to 24E. The curves 24A to 24E can be used to define regions of the wafer including LEDs having similar light emission characteristics. Because diodes in the different regions have different dominant wavelengths, when the diodes are used to form broad spectrum light emitting devices, it may be desirable to provide wavelength conversion structures, such as phosphor layers, having different compositions, thicknesses and/or shapes, so that the broad spectrum light emitted by the different devices may be more uniform. Similar maps can be prepared showing curves of constant radiant flux emitted by the devices.

According to some embodiments, wavelength conversion structures, such as phosphor layers, having different compositions, thicknesses and/or shapes, can be formed on light emitting elements through stereolithographic methods. Previously, stereolithography has been used as a rapid prototyping technology, in which prototypes of parts or other equipment are fabricated with high accuracy from computer models. However, embodiments of the invention use stereolithographic methods not for prototyping of parts, but for building wavelength conversion structures on light emitting elements. By using stereolithography to form the wavelength conversion structures, custom wavelength conversion structures can be formed on light emitting elements. These custom wavelength conversion structures can be designed and formed based on the optical properties of individual devices, which can vary from device to device. Such properties can include, for example, the dominant wavelength, spectral purity, emission intensity (radiant flux), angular light distribution pattern, and/or other properties of the device. Providing custom wavelength conversion structures on light emitting elements can help ensure that the completed devices generate more uniform final light output.

Stereolithography is a fabrication process that uses a laser scanning system to selectively cure a pattern in a thin surface layer of photo-curable liquid polymer contained in a vat. After the pattern has been cured, the cured layer is lowered in the vat on a vertically adjustable platform, and coated with another layer of photo-curable liquid polymer. The next layer of photo-curable liquid polymer is then selectively cured with the scanned laser to form a second pattern that adheres to the first pattern. By varying the shape of the cured patterns from step to step, a solid structure having a desired shape can be slowly built up, layer by layer.

A system for performing stereolithography is referred to as a stereolithographic apparatus (or SLA). In a typical SLA system, the platform is lowered by about 0.05 mm to about 0.15 mm after each layer pattern is defined.

Figure 4A:
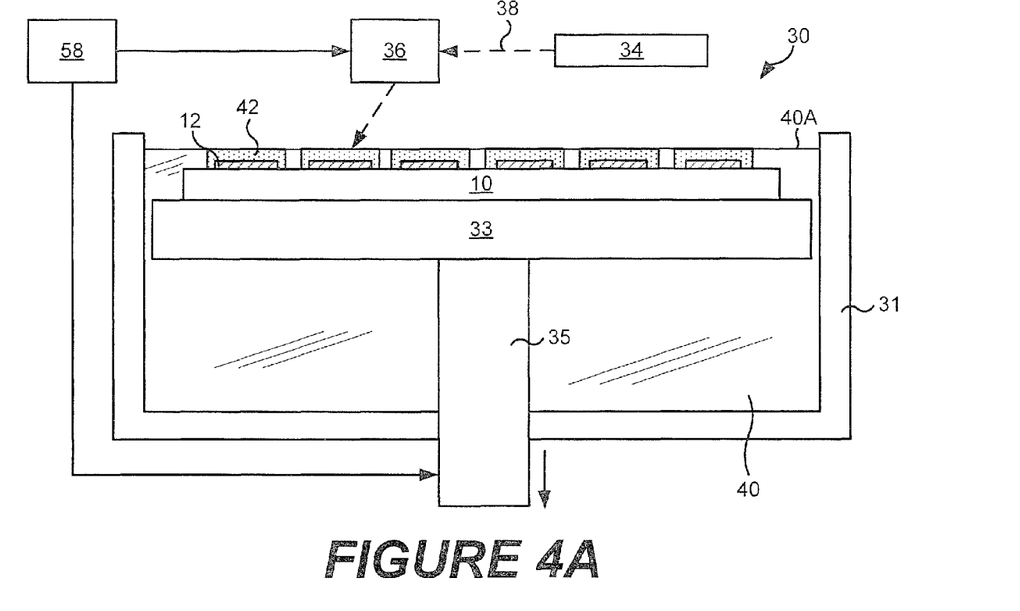
FIGS. 4A and 4B are schematic diagrams illustrating apparatus and methods of forming wavelength conversion structures according to some embodiments of the invention.

An SLA system 30 according to some embodiments is illustrated in FIG. 4A. As shown therein, the SLA system 30 includes a vat 31 containing a photo-curable liquid polymer 40, such as a UV-curable liquid silicone. Available UV-curable liquid silicones include, for example, UV9200 from GE Advanced Materials. Non silicone photo-curable polymers, such as DSM WaterClear Ultra10122, and DSM WaterShed XC 11122 can also be used as the photo-curable polymer. The photo-curable liquid polymer 40 can contain a wavelength conversion material, such as phosphor particles, that can absorb primary light emitted by an LED and responsively re-emit secondary light having a longer wavelength. The amount of primary light absorbed by the wavelength conversion material may depend on the thickness of the wavelength conversion material. Furthermore, the wavelength of secondary light emitted by the wavelength conversion material depends on the composition of the wavelength conversion material. For example, different phosphors emit different colors of light in response to stimulation by the primary emission from an LED. As noted above phosphors are available that emit blue, green, yellow, and red light in response to primary light emitted by blue and/or UV LEDs.

A platform 33 is suspended over or within the vat 31 by a controllable piston 35. The height of the platform 33 is controlled by a controller 58, which can electronically control vertical displacement of the piston 35. A substrate 10 including a plurality of light emitting elements 12 is placed on the platform 33, and the platform 33 is lowered in to the vat 31 so that a surface 40A of the photo-curable liquid polymer 40 is above the light emitting elements 12. A sweeper (not shown) may be used to sweep the photo-curable liquid polymer 40 across the surface of the substrate 10. Furthermore, the substrate 10 can be held in position on the platform by an optional support substrate, wafer carrier, or other device.

A laser 34 generates a laser beam 38. The laser 34 may be a UV laser that generates a laser beam having a wavelength that is effective to cure the photo-curable liquid polymer 40. The laser beam 38 is steered by a scanning system 36 in response to commands from the controller 58 to selectively cure a portion of the photo-curable liquid polymer 40 over the light emitting elements 12. The platform 33 may then be lowered by a predetermined distance, and the previously cured pattern covered with the photo-curable liquid polymer 40. The process can then be repeated until wavelength conversion structures 42 having desired shapes and/or thicknesses are built Up on the light emitting elements 12.

The laser beam may have a power level that is sufficient to at least partially cure the photo-curable liquid polymer. However, the laser beam may not be powerful enough, or be applied for a long enough time, to completely cure the photo-curable liquid polymer. Therefore, a subsequent curing step may be utilized after the wavelength conversion structure 42 has been formed to completely cure the photo-curable liquid polymer. The subsequent curing step may include a heat curing step.

It will be appreciated that because the wavelength conversion structures 42 are built up on the light emitting elements 12 individually by selectively scanning the laser beam 38 over the photo-curable liquid polymer 40, the shapes and/or thicknesses of the individual wavelength conversion structures 42 formed on a substrate 10 can be different. For example, if a particular 12 has a lower radiant flux, then the system 30 may form a thinner wavelength conversion structure 42 on that light emitting element 12.

Although not illustrated in FIG. 4A, similar methods may be used to build up wavelength conversion structures on LED packages 16 shown in FIG. 2A.

Figure 4B:
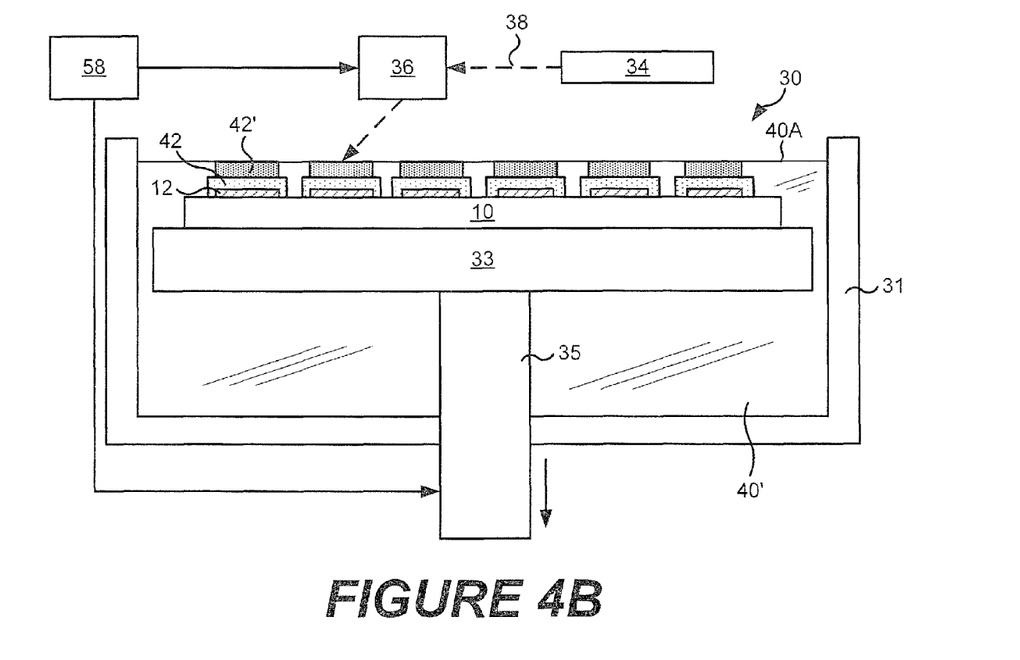

Referring to FIG. 4B, second wavelength conversion structures 42' can be selectively built up on the first wavelength conversion structures by stereolithography. The second wavelength conversion structures 42' can be formed using a second photo-curable liquid polymer 40' that may include a different type and/or composition of phosphor than the photo-curable liquid polymer 40 that was used to form the wavelength conversion structures 42. For example, the first wavelength conversion structures 42 may include a yellow phosphor, while the second wavelength conversion structures 42' may include a red and/or green phosphor. By providing multiple wavelength conversion structures 42, 42' including different types of phosphors on the light emitting elements 12, the light emitted by the completed device may have a desired color temperature, color rendering index, or other optical property. Furthermore, the properties (e.g., shape, thickness, etc.) of the second wavelength conversion structures 42' may be tailored to match the light output characteristics of individual ones of the light emitting elements 12, so that the light emitted by the completed device may be more uniform.

The remaining features of FIG. 4B are similar to the corresponding features of FIG. 4A.

Figure 5:
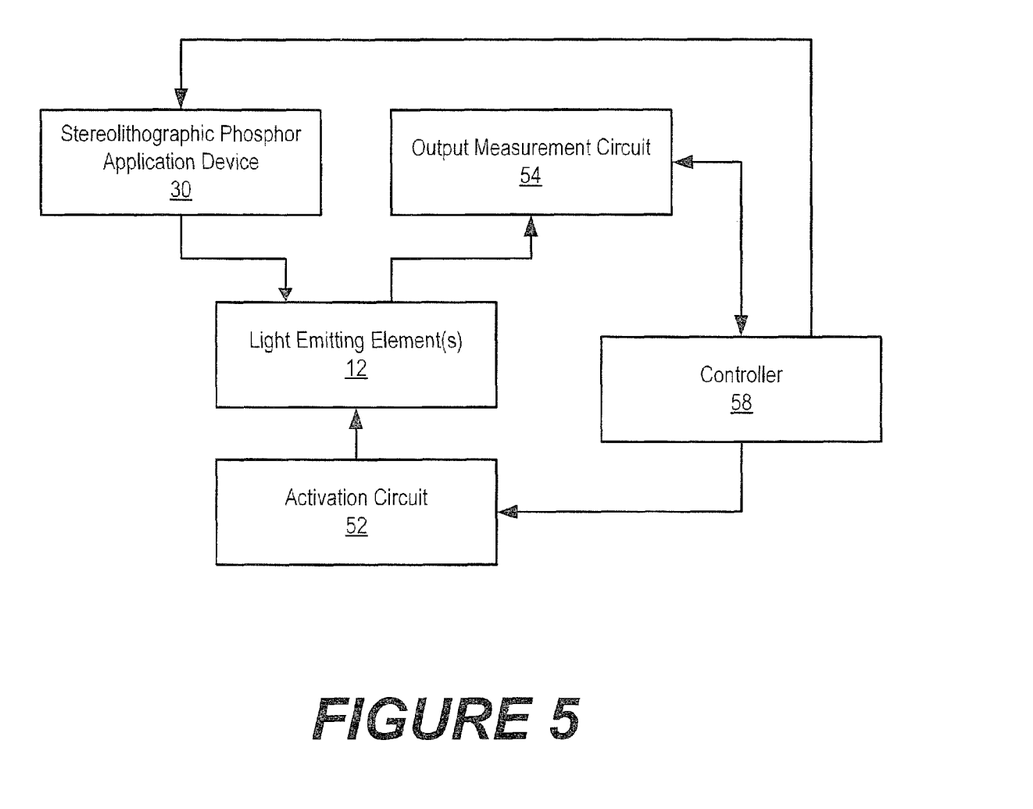
FIG. 5 is a block diagram illustrating apparatus and methods of forming wavelength conversion structures according to some embodiments of the invention.

FIG. 5 illustrates a system that may be utilized to fabricate broad spectrum light emitting devices according to embodiments of the present invention. As illustrated in FIG. 5, a plurality of light emitting elements 12 are provided. In some embodiments, the light emitting elements may include LEDs or laser diode devices and may be provided on a wafer and/or die such that the light emitting elements may be activated either individually or collectively. The LEDs and/or lasers may have contacts on opposite sides of the device or may have two contacts on a single side of the device. In other embodiments the light emitting elements may include packaged and/or mounted devices.

For example, the light emitting elements may be gallium nitride based LEDs or lasers fabricated on a silicon carbide substrate such as those devices manufactured and sold by Cree, Inc. of Durham, N.C., the assignee of the present invention. Gallium nitride based devices may emit light in the UV to green wavelength ranges.

As is further illustrated in FIG. 5, an activation circuit 52 is also provided. The activation circuit 52 activates the light emitting elements 12, 16 so that the light emitting elements 12, 16 emit light. Such activation may be performed individually in a sequential fashion or simultaneously activating some or all of the light emitting elements 12, 16. For example, where the light emitting elements are provided as undiced elements on a semiconductor wafer, the wafer may be probed and the devices 12 can be individually activated by passing an electric current therethrough.

Similarly, subsets of the plurality of light emitting elements 12, 16 can be activated. The particular technique for activating the light emitting elements 12 may depend on the configuration of the electrodes for the light emitting elements 12, 16. The output measurement circuit 54 measures one or more optical properties of the light emitting elements 12, 16, such as the radiant flux, spectral distribution, and/or angular distribution of light emitted by the light emitting elements 12, 16. The output measurement circuit 54 may include a spectrum analyzer or other such device for analyzing the frequency and/or power of light output of the light emitting elements 12. Such devices are known to those of skill in the art and, therefore, need not be described further herein.

The output measurement circuit 54 provides the measurement information to a controller 58. The controller 58 utilizes the light output information to control the stereolithographic phosphor application device 30 that selectively forms wavelength conversion structures on the light emitting elements 12, 16 based on the measurements.

The stereolithographic phosphor application device 30 is configured to selectively form wavelength conversion structures including a luminescent material, such as YAG:Ce phosphor or the like, in the manner described above with respect to FIGS. 4A and 4B.

Differing amounts of luminescent material may be applied to differing devices before or after singulation utilizing application techniques that provide for the selective formation of wavelength conversion structures on individual devices or groups of devices.

Finally, the controller 58 maybe any suitable controller capable of coordinating the operations as described herein for selectively applying luminescent material to light emitting elements. For example, the controller 58 may be a programmable microcontroller, a personal computer or other data processing system.

Figure 6:
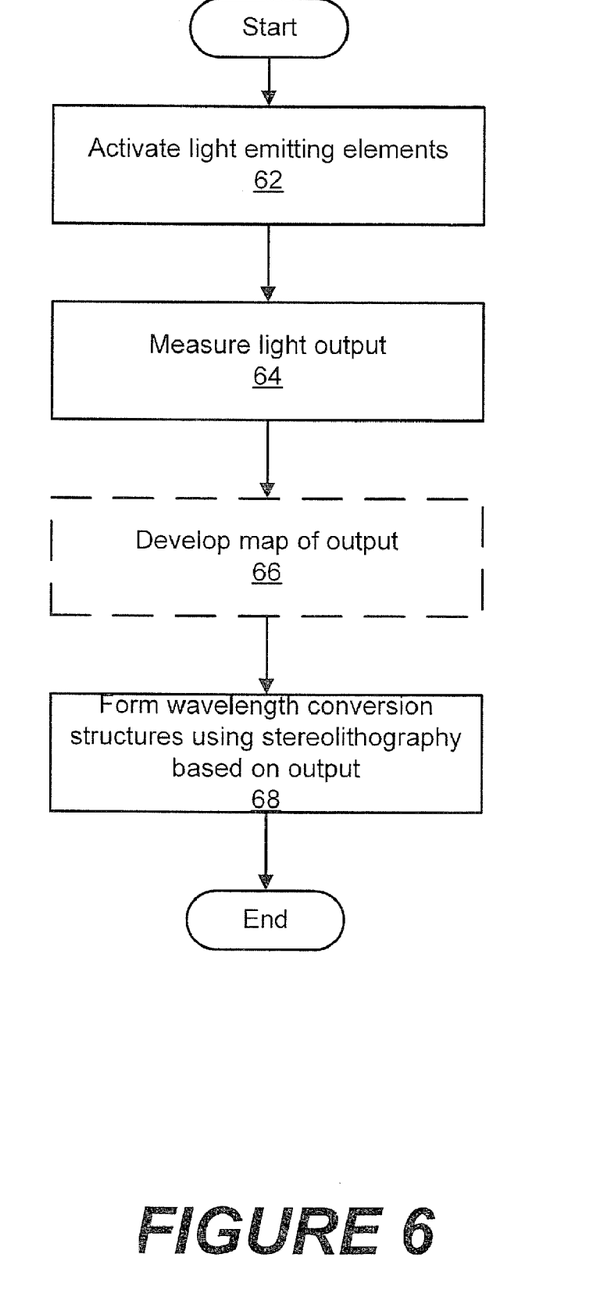
FIG. 6 is a flowchart illustrating operations according to some embodiments of the present invention.

FIG. 6 illustrates operations according to certain embodiments of the present invention. The operations of FIG. 6 will be described with reference to FIGS. 1A, 4A and 5. Referring to FIG. 6, the light emitting elements 12 are activated (block 62) and the output of the light emitting elements 12 is measured (block 64). Such activation, for example, may be provided by the activation circuit 52 contacting electrodes of the light emitting elements, either in parallel, in groups, and/or individually, such that a forward electrical bias may be applied to the light emitting elements 12 when the activation circuit 52 is instructed to do so by the controller 58. Such activation of the light emitting elements 12 may be performed simultaneously, sequentially by individual elements and/or sequentially by groups of elements.

Furthermore, the output of the light emitting elements may be measured at differing resolutions. For example, the output of each individual light emitting element 12 could be measured or the output of groups of light emitting elements 12 could be measured.

As is further seen in FIG. 6, optionally, a map of the output of the light emitting elements, such as the wafer contour map of FIG. 3, may be generated (block 66) to indicate which of the light emitting elements may need additional application (s) and/or increased thicknesses of wavelength conversion materials. The map relates the location of a light emitting element with its output such that the size, shape and/or composition of the wavelength conversion structure formed on the light emitting element may be based on the measured output.

Wavelength conversion structures are then selectively formed on the light emitting elements 12 using stereolithography based on the measured output of the light emitting elements 12 such that different ones of the light emitting elements in the same wafer and/or die may have different wavelength conversion structures formed thereon (block 68).

Figure 7:
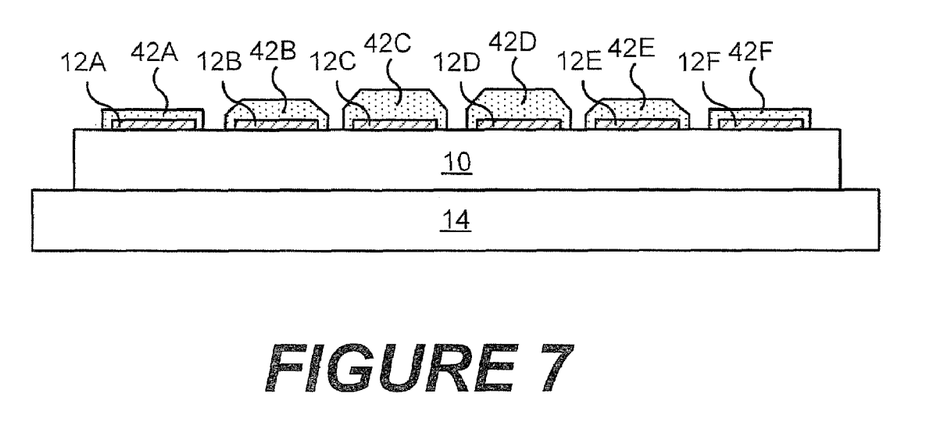
FIG. 7 is a side view of a semiconductor wafer including light emitting elements thereon and wavelength conversion structures according to some embodiments of the invention.

For example, as illustrated in FIG. 7, a substrate 10 includes light emitting elements 12A to 12F. Wavelength conversion structures 42A to 42F are formed on corresponding ones of the light emitting elements 12A to 12F. The output of the light emitting elements 12A to 12F may be measured as described above and it is determined that a first subset of light emitting elements, including devices 12C and 12D, have an output which requires thicker wavelength conversion structures 42C, 42D to be formed on these light emitting elements than the remaining ones of the light emitting elements, and a second subset of light emitting elements including light emitting elements 12A and 12F have an output which requires thinner wavelength conversion structures 42A and 42F to be formed on these devices 12 than the remaining ones of the light emitting elements 12.

Furthermore, the shape of the wavelength conversion structures 42A-42F may be varied from device to device. Variation in the shape of the wavelength conversion structures may help improve angular uniformity of the color of emission. In devices formed using conventional phosphor application techniques, the apparent color of the final light emission may vary with viewing angle. For example, the devices may appear more blue when viewed directly on and may appear more yellow when viewed from the side. However, using techniques according to embodiments of the invention, the wavelength conversion structures can be formed to have custom shapes. For example, the wavelength conversion structures can be designed based on the angular intensity of emission of a light emitting elements 12, so that the thickness of wavelength conversion material through which various rays emitted by the light emitting element pass is based on the intensity of the ray. In this manner, a more uniform light output may be obtained from the device.

Figure 8:
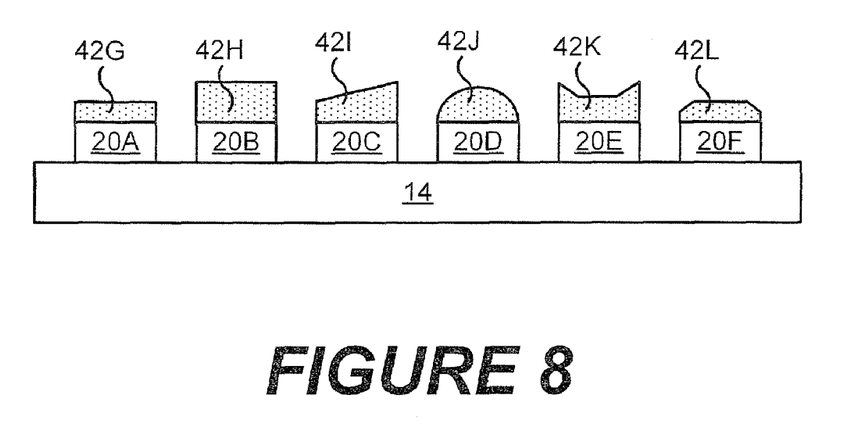
FIG. 8 is a side view of a support substrate including LED packages thereon and wavelength conversion structures according to some embodiments of the invention.

In FIG. 7, the corners of the wavelength conversion structures 42B to 42E have been formed to be chamfered. As shown in FIG. 8, many different shapes can be formed using stereolithographic techniques described herein. FIG. 8 illustrates a support substrate 14 on which a plurality of LED packages 20A to 20F are formed. Custom wavelength conversion structures 42G to 42L are formed on respective ones of the LED packages 20A to 20F. As illustrated in FIG. 8, the custom wavelength conversion structures can be relatively thinner (42G) or thicker (42H); they can have a thickness that increases from one side of the package to another (42I); they can be curved to form a plano-convex lens (42J) (although a plano-concave lens is also possible); they can thicker at the edges (42K) or be chamfered at the edges (42L). Many other variations are possible using techniques according to embodiments of the invention, due to the flexibility of the stereolithography approach.

Figure 9:
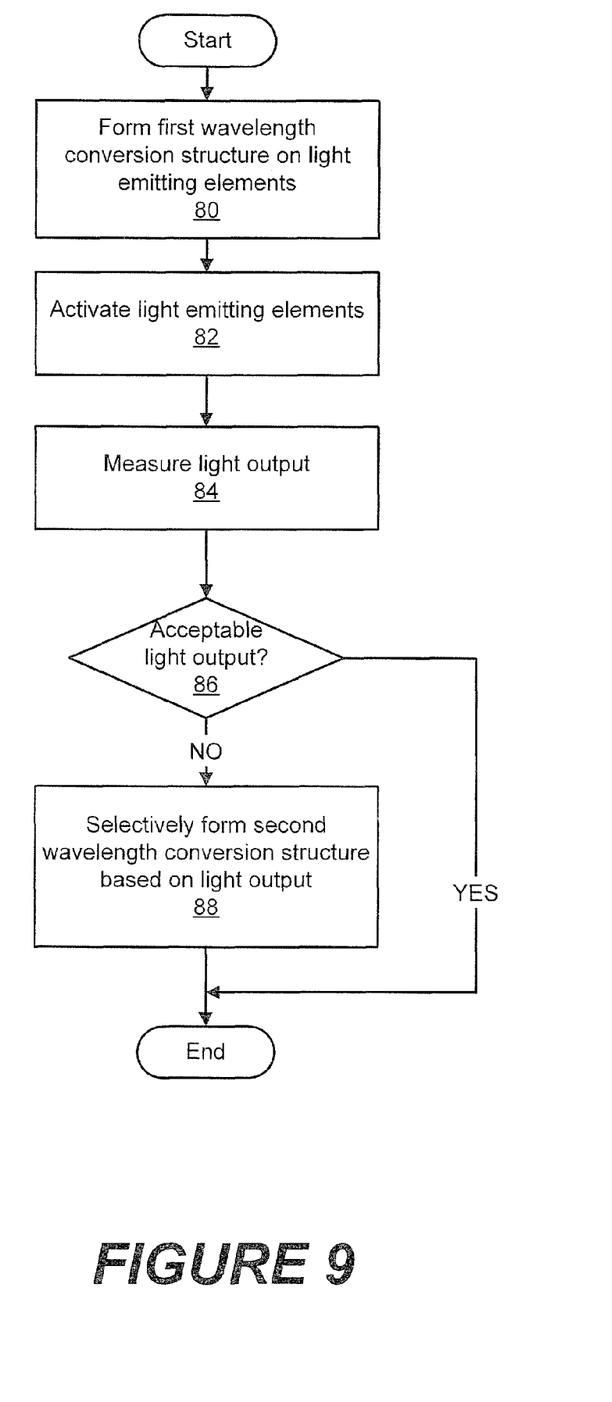
FIG. 9 is a flowchart illustrating operations according to further embodiments of the present invention.

FIG. 9 illustrates operations according to further embodiments of the present invention. As seen in FIG. 9, a first wavelength conversion structure may be formed on light emitting elements 12, 16 (block 80). The first wavelength conversion structure may be formed using stereolithography and/or my some other application technique, such as by flowing a fluid containing a phosphor-containing material onto a wafer or substrate including the light emitting elements 12, 16, by inkjet application of the material, by air brush application of the material, by dusting the wafer when the surface of the wafer is charged (electrostatic application) or other such techniques for application of a wavelength conversion material to a light emitting element. Such an application may, for example, be provided by the stereolithographic phosphor application device 30 under control of the controller 58.

The light emitting elements, or groups of the devices, are activated (block 82) and the output of the light emitting elements is measured (block 84). Such activation, for example, may be provided by the activation circuit 52 contacting electrodes of the light emitting elements, either in parallel, in groups, or individually, such that a forward electrical bias may be applied to the light emitting elements when the activation circuit 52 is instructed to do so by the controller 58. Such activation of the light emitting elements 12, 16 may be performed simultaneously, sequentially by individual devices or sequentially by groups of devices. Furthermore, in certain embodiments of the present invention, the activation and measurement of light output may be performed prior to device singulation. As discussed above, the output of the light emitting elements may be measured at differing resolutions.

A second wavelength conversion structure may then be selectively formed on the light emitting elements 12, 16 based on the measured output of the light emitting elements such that different ones of the light emitting elements in the same wafer and/or die may have different wavelength conversion structures formed thereon (block 88).

After application of the luminescent material is carried out, the output of the light emitting elements including first wavelength conversion structures can again be measured. It is determined if the output of the light emitting elements has an acceptable output, such as being within a predefined range for the device, for example, the acceptable manufacturing tolerances for light output. In any event, if acceptable light output is not achieved, the operations at blocks 82-88 may be repeated until such output is achieved.

As is described above, embodiments of the present invention may provide a broad spectrum light emitting device through selective formation of a wavelength conversion structure, such as a phosphor-containing layer. In particular embodiments of the present invention, a white light emission device is provided by selective formation of a wavelength conversion structure based on the output characteristics of the individual device. Furthermore, while the present invention has been described with reference to the selective formation of a wavelength conversion structure, in other embodiments of the present invention, the type of phosphor or the doping of the phosphor in the photo-curable liquid polymer could be altered based on the measured characteristics of a light emitting element. Thus, for example, a first wavelength conversion structure including a first phosphor could be formed on an LED, followed by a selective formation of a second wavelength conversion structure including a second phosphor so as to provide the desired broad spectrum device. Similarly, the particular doping or phosphor used to form a device could be adjusted based on the measured output of the device. Accordingly, embodiments of the present invention should not be construed as limited to varying the thickness of a wavelength conversion structure but may also be utilized to vary the shape and/or composition of a wavelength conversion structure so as to provide light emitting devices with desired light output characteristics.

In the drawings, certain operations/acts and or blocks which have been indicated as optional are shown in dashed lines. The presence or lack of such a dashed line shall not, however, be construed as requiring any of the elements of the figures to carry out particular embodiments of the present invention. Furthermore, while a particular breakdown or division of functions has been illustrated in certain figures, as will be appreciated by those of skill in the art in light of the present disclosure, other divisions of functions may be provided while still benefiting from the teachings of the present invention. Thus, for example, blocks in the block diagrams may be combined, or additional blocks added, while still falling under the teachings of the present invention. Similarly, additional blocks may be added, blocks combined or operations may be performed in a different sequence than that illustrated in the flowchart illustrations. Thus, the present invention should not be construed as limited to the particular illustrations provided herewith but is intended to cover any such methods, systems or devices utilizing the selective application of luminescent materials as described herein.

In the drawings and specification, there have been disclosed typical preferred embodiments of the invention and, although specific terms are employed, they are used in a generic and descriptive sense only and not for purposes of limitation.

That which is claimed is:

1. A method of forming a light emitting device, comprising:
   selectively forming a wavelength conversion structure on a light emitting element by repeatedly covering the light emitting element with a photo-curable liquid polymer containing a luminescent material and exposing the liquid polymer to a laser beam in a predefined pattern for a time sufficient to at least partially cure the liquid polymer, to thereby build up a wavelength conversion structure having a desired shape on the light emitting element.

2. The method of claim 1, further comprising measuring light output of the light emitting element, wherein selectively forming the wavelength conversion structure comprises selectively forming layers of a luminescent material on the light emitting element based on the measured light output of the light emitting element.

3. The method of claim 1, wherein the light emitting element comprises a light emitting diode chip.

4. The method of claim 1, wherein the light emitting element comprises a light emitting diode package.

5. The method of claim 1, wherein selectively forming the wavelength conversion structure comprises selectively forming layers of cured polymer on the light emitting element based on the measured light output of the light emitting element.

6. The method of claim 1, wherein the light emitting element comprises a substrate including a plurality of light emitting elements thereon, wherein measuring light output of a semiconductor light emitting element comprises measuring light output of respective ones of the light emitting elements, and wherein selectively forming the wavelength conversion structure comprises selectively forming polymer layers on respective ones of the light emitting elements based on the measured light output of the respective light emitting elements.

7. The method of claim 1, further comprising using stereolithography to successively build up patterned layers of polymer including a luminescent material on the light emitting element to form a wavelength conversion structure having a predetermined shape.

8. The method of claim 1, wherein the wavelength conversion structure comprises a first wavelength conversion structure including a first luminescent material, the method further comprising:
   forming a second wavelength conversion structure on the first wavelength conversion structure, the second wavelength conversion structure including a second luminescent material that has a different optical property than the first luminescent material.

9. The method of claim 2, further comprising repeating the measurement of light output and the selective formation of layers of luminescent material until the measured light output of the light emitting element including the layers of luminescent material meets a predefined criterion.

10. The method of claim 2, wherein the measured light output comprises at least one of a frequency of light output and/or a radiant flux of light output.

11. The method of claim 5, wherein selectively forming the wavelength conversion structure further comprises selectively shaping the polymer layers on the light emitting element.

12. The method of claim 6, wherein selectively forming the wavelength conversion structure comprises applying at least one of different thicknesses of luminescent material, differently doped luminescent material and/or different luminescent materials to different ones of the light emitting elements.

13. A method of forming a light emitting device, comprising:
   covering a light emitting element with a photo-curable liquid polymer containing a luminescent material; and
   selectively exposing a first portion of the liquid polymer to light for a time sufficient to at least partially cure the first portion of liquid polymer, while leaving a second portion of the liquid polymer uncured.

14. The method of claim 13, further comprising repeatedly covering the light emitting element with the photo-curable liquid polymer containing a luminescent material and selectively exposing portions of the liquid polymer to a laser beam for a time sufficient to at least partially cure the exposed portions of liquid polymer, to thereby build up a wavelength conversion structure having a desired shape on the light emitting element.

15. The method of claim 13, wherein the luminescent material comprises a first luminescent material, the method further comprising:
   covering the light emitting element with additional photo-curable liquid polymer containing a second luminescent material having a different optical property than the first luminescent material; and
   selectively exposing a portion of the additional liquid polymer to light for a time sufficient to at least partially cure the additional liquid polymer.

16. The method of claim 13, wherein exposing the liquid polymer to light comprises directing a laser beam towards the liquid polymer in a predetermined pattern.

17. The method of claim 16, wherein the predetermined pattern comprises a first pattern, the method further comprising:
   covering the light emitting element including the at least partially cured liquid polymer with additional photo-curable liquid polymer containing a second luminescent material having a different optical property than the first luminescent material; and
   directing a laser beam towards the liquid polymer in a second pattern that is different from the first pattern for a time sufficient to at least partially cure the additional liquid polymer in the second pattern.

18. A method of forming a light emitting device, comprising:
   forming a first wavelength conversion structure on a light emitting element;
   measuring light output of the light emitting element including the first wavelength conversion structure; and
   selectively forming a second wavelength conversion structure on the light emitting device by covering the light emitting element with a photo-curable liquid polymer containing a luminescent material and exposing the liquid polymer to light for a time sufficient to at least partially cure the liquid polymer, based on the measured light output of the light emitting element.

* * * * *